United States Patent [19]

Rusznyak

[11] 4,110,637
[45] Aug. 29, 1978

[54] ELECTRONIC SYSTEM FOR CAPACITIVELY STORING A SIGNAL VOLTAGE OF PREDETERMINED LEVEL

[75] Inventor: Andreas Rusznyak, Chene-Bougeries, Switzerland

[73] Assignee: Ebauches S.A., Neuchâtel, Switzerland

[21] Appl. No.: 815,016

[22] Filed: Jul. 12, 1977

Related U.S. Application Data

[63] Continuation-in-part of Ser. No. 711,879, Aug. 5, 1976, abandoned.

[30] Foreign Application Priority Data

Aug. 8, 1975 [CH] Switzerland .................. 10363/75

[51] Int. Cl.$^2$ .................. H03K 17/60; G11C 11/24
[52] U.S. Cl. .................. 307/238; 307/246; 307/251; 307/DIG. 4
[58] Field of Search .......... 307/238, 221 C, 246, 307/251, 264, 270, DIG. 4

[56] References Cited

U.S. PATENT DOCUMENTS

| | | | |
|---|---|---|---|
| 3,699,544 | 10/1972 | Joynson et al. | 307/238 X |
| 3,702,926 | 11/1972 | Picciano | 307/205 X |
| 3,744,037 | 7/1973 | Spence | 307/238 X |
| 3,798,616 | 3/1974 | Spence | 307/238 X |
| 3,855,581 | 12/1974 | Greene | 307/DIG. 4 X |
| 3,903,431 | 9/1975 | Heeren | 307/246 X |
| 3,922,650 | 11/1975 | Schaffer | 307/238 X |
| 3,924,247 | 12/1975 | Spence | 307/238 X |
| 3,943,496 | 3/1976 | Padgett et al. | 307/DIG. 4 X |
| 3,988,617 | 10/1976 | Price | 307/246 X |

FOREIGN PATENT DOCUMENTS

| | | | |
|---|---|---|---|
| 1,957,935 | 5/1973 | Fed. Rep. of Germany | 307/238 |
| 488,258 | 2/1976 | U.S.S.R. | 307/238 |

*Primary Examiner*—Larry N. Anagnos
*Attorney, Agent, or Firm*—Karl F. Ross

[57] ABSTRACT

An electronic circuit arrangement designed to store for an indefinite period a signal voltage of predetermined magnitude briefly applied thereto, comprises a main storage capacitor $C_s$ connected via a first semiconductor switch $T_1$ across a supply of unipolar voltage and via a second semiconductor switch $T_2$ across an ancillary storage capacitor $C_x$, the latter lying in series with a binary capacitor $C_i$ between two conductors M, $\Phi_1$ across which a clock pulse $V_{\Phi 1}$ is periodically generated. The semiconductor switches are field-effect transistors of the insulated-gate type (IGFETs), the gate of the first IGFET $T_1$ being tied to the junction X between the ancillary storage capacitor $C_x$ and the gate of the binary capacitor $C_i$; this junction X communicates with the junction S between the two IGFETs and the main storage capacitor $C_s$ in the conductive state of the second IGFET $T_2$ whose gate receives a series of unblocking pulses $V_{\Phi 2}$, lagging behind the clock pulses $V_{\Phi 1}$. The unblocking pulses may be generated at the same cadence as the train of clock pulses, in interleaved relationship therewith; they could also be derived from the junction S between the first IGFET $T_1$ and capacitor $C_s$ by having that junction tied to the gate of the second IGFET $T_2$, the latter thus acting as a diode which conducts after the first IGFET $T_1$ has been turned on to recharge the capacitor $C_s$. The generator of clock pulses $V_{\Phi 1}$ may serve as the voltage supply for the first IGFET $T_1$ by having one of its conductors, $\Phi_1$, joined to the channel of that IGFET via a third IGFET $T_3$ connected as a diode.

7 Claims, 7 Drawing Figures

ELECTRONIC SYSTEM FOR CAPACITIVELY STORING A SIGNAL VOLTAGE OF PREDETERMINED LEVEL

CROSS-REFERENCE TO RELATED APPLICATION

This is a continuation-in-part of my copending application Ser. No. 711,879, filed Aug. 5, 1976, now abandoned.

FIELD OF THE INVENTION

The present invention relates to an electronic circuit arrangement serving as a dynamic memory stage for the indefinite capacity of storage of a signal voltage of a predetermined nominal level, designed to represent the logical value "one" as distinct from "zero" or ground level.

BACKGROUND OF THE INVENTION

Signals to be preserved for a long time in the form of capacitive charges are subject to decay because of leakage losses. Various systems have already been designed to compensate for such leakage losses, lately with the aid of so-called binary or field-effect capacitors whose capacitance varies between two distinct values upon the application and removal of a certain biasing voltage. Reference in this connection may be made, for example, to the article "BINÄRE KAPAZITÄTEN IN MOS-SCHALTUNGEN" by L. Talamonti — "ELEK-TRONIK" 1973 Vol. 5.

In such a system, described as prior art in U.S. Pat. No. 3,943,496, a storage capacitor is temporarily connectable to an external signaling circuit for selective charging and discharging to establish either of the two aforementioned logical values "1" and "0". The storage capacitor is connected through a first field-effect transistor of the insulated-gate type (IGFET) across a supply of direct current and through a second IGFET in series with a binary capacitor (BICAP) across a source of unipolar clock pulses; one of the channel electrodes (source or drain) of each IGFET forms with the storage capacitor a first node or junction communicating, in the conductive state by the second IGFET, with a second node or junction formed by the other channel electrode of the latter IGFET with the control gate of the BICAP. The gate of the first IGFET is tied to this second junction, thus receiving the clock pulses by way of the BICAP, whereas the gate of the second IGFET is permanently biased by the d-c supply.

In the prior-art system just described, the second IGFET conducts as long as the potential of the first junction is at or close to zero level so as to maintain the second junction at virtually the same level. Under these conditions the capacitance of the BICAP is low and lies effectively in series with that of the storage capacitor whereby the applied clock pulses appear at the second junction in greatly attenuated form. When the storage capacitor is charged to the level "one", differing by less than the threshold voltage of the second IGFET from the supply voltage, the potential of the second junction is similarly increased whereby this IGFET is cut off and isolates the storage capacitor from the BICAP whose own capacitance is raised to its high value by the change in the voltage of the second junction. The next clock pulse, therefore, reaches the gate of the first IGFET with a sufficient amplitude to render that IGFET conductive and therefore to enable a recharging of the storage capacitor from the supply to compensate for leakage losses.

Whenever the potential of the second junction drops sufficiently to reactivate the second IGFET, the potential of the first junction decreases. If the leakage loss between clock pulses is so large that the potential of the storage capacitor is reduced to a level well below the difference between the supply and threshold voltages, the conduction of the second IGFET during the occurrence of the next clock pulse (and therefore the presence of the storage capacitor in series with the BICAP) may prevent the retriggering of the first IGFET to replenish the charge of the storage capacitor — and thus to refresh the stored signal of logical value "one" — unless the capacitance of the BICAP is large compared with that of the storage capacitor. To ensure proper operation, therefore, the BICAP must be of substantial relative size. In the case of a multistage memory designed to store the several stage outputs of a binary frequency divider in an electronic wristwatch, for example, the resulting dimensions of an integrated-circuit chip may make the use of such a signal-refresher circuit impractical.

OBJECTS OF THE INVENTION

An important object of my present invention, therefore, is to provide an improved storage system of the general character described which is substantially more compact than the conventional one, especially when realized by integrated circuitry.

Another object of the invention is to provide a circuit arrangement of this nature particularly adapted for use in a system, such as that of an electronic wristwatch, which is powered by a battery of low terminal voltage (e.g. 1.5 V) and limited storage capacity (say, on the order of 100 mAh).

A further object is to provide a system of this nature which, upon the application of a signal voltage of a certain minimum value to either of its junctions, automatically increases that voltage to a predetermined higher level and substantially maintains it at that level for subsequent readout at either junction.

SUMMARY OF THE INVENTION

I realize these objects, in accordance with my present invention, by the provision of means for invariably disconnecting the two junctions of the aforedescribed circuit arrangement from each other in the presence of a clock pulse whereby that pulse, delivered to the second junction by way of the BICAP, no longer charges the storage capacitor at the first junction which is rechargeable directly from the supply and which will be referred to hereinafter as the main storage capacitor. An ancillary storage capacitor tied to the second junction represents the only capacitance lying in series with the BICAP during the occurrence of a clock pulse and can be made as small as necessary to permit a dimensioning of the BICAP within existing space limitations. The two storage capacitors are connected to what has been described in my copending application as the common point of the system, i.e. the point toward which the capacitors tend to discharge, which will be referred to hereinafter as ground and which also constitutes one of the terminals of the supply of charging voltage, the charging circuit of the main storage capacitor including a first semiconductor element or switch such as the first IGFET discussed above. The ungrounded terminals of the two storage capacitors, representing the aforementioned junctions, are interconnected by a second semiconductor element or switch which may again be an IGFET but, unlike the second IGFET of the aforedescribed prior-art system, allows the transfer of charges from the main to the ancillary storage capacitor only between clock pulses while preventing a reverse charge transfer in the presence of a clock pulse. The latter semiconductor element may be a simple diode, or an IGFET connected as a diode, or else an IGFET having its gate driven by a train of unblocking pulses of the same cadence as the clock pulses but offset with reference thereto.

The supply means for recharging the main storage capacitor upon conduction of the first IGFET, or its equivalent, may comprise a generator of continuous direct current such as a battery. Alternatively, that capacitor may be recharged by the clock pulses themselves, the supply means then comprising a diode (or a further IGFET connected as a diode) inserted between the first semiconductor element and a conductor carrying the clock pulses.

BRIEF DESCRIPTION OF THE DRAWING

My invention will now be described in detail with reference to the accompanying drawing in which.

SPECIFIC DESCRIPTION

Figure 1A:
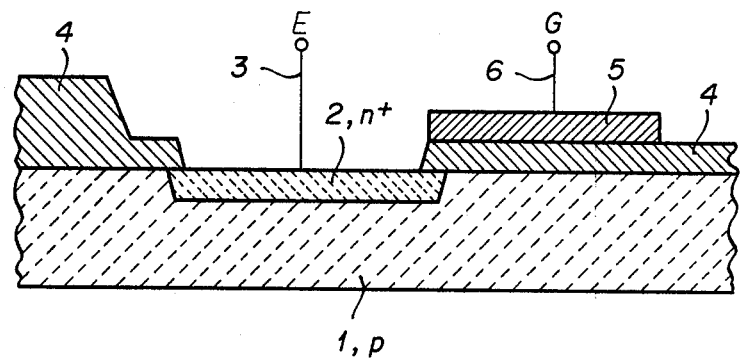
FIG. 1A is a fragmentary cross-sectional view of a binary capacitor (BICAP) utilized in a system according to my invention.

In FIG. 1A I have shown a binary capacitor (BICAP) of the well-known field-effect type which may form part of an IC chip and comprises a p-type semiconductor substrate 1, usually of silicon, with an $n^+$-type zone 2 to which a lead 3 is attached, the free end E of this lead forming one of the terminals of the capacitor. The surface of substrate 1 is overlain by an insulating layer 4, e.g. of silicon oxide, extending partly over zone 2 but leaving free the major portion of that zone. Layer 4 carries a metal electrode 5 which also extends partly above zone 2 and is connected by way of a lead 6 to the second terminal G of the capacitor.

By analogy with a field-effect transistor of the MOSFET type, from which the BICAP shown in FIG. 1A differs by the lack of a drain region, zone 2 may be regarded as a source whereas electrode 5 constitutes a gate. Zone 2 and electrode 5 can be considered as the two plates of the capacitor, with layer 4 representing the intervening dielectric.

Figure 1B:
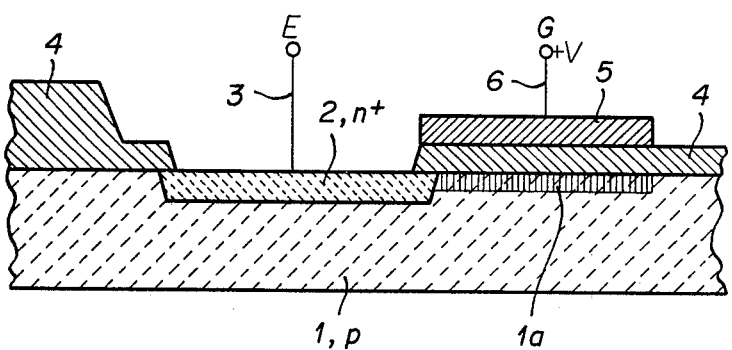
FIG. 1B is a view similar to FIG. 1A, showing the BICAP biased into a state of increased capacitance.
Figure 1C:
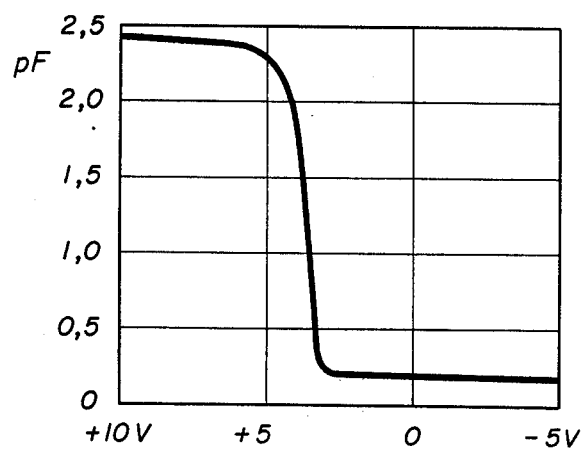
FIG. 1C is a graph illustrating the operation of the BICAP shown in FIGS. 1A and 1B.

With the polarities indicated, the capacitor shown in FIG. 1A has a relatively small capacitance as long as the potential of terminal G is close to that of terminal E or negative with reference thereto. When a positive biasing voltage $+V$ exceeding a certain threshold is applied to terminal G, as indicated in FIG. 1B, the resulting concentration of negative charge carriers in the area of substrate 1 underlying the gate 5 produces an inversion zone $1a$ which acts as an extension of zone 2 and multiplies the capacitance of the device, e.g. by a factor of 10. This has been illustrated in FIG. 1C where, above a threshold voltage of about $+3$ V, the capacitance sharply rises from approximately 0.25 pF to almost 2.5 pF. Naturally, if the p-type and n-type zones of the capacitor are interchanged, such a jump in capacitance occurs with negative biasing voltages.

Figure 2:
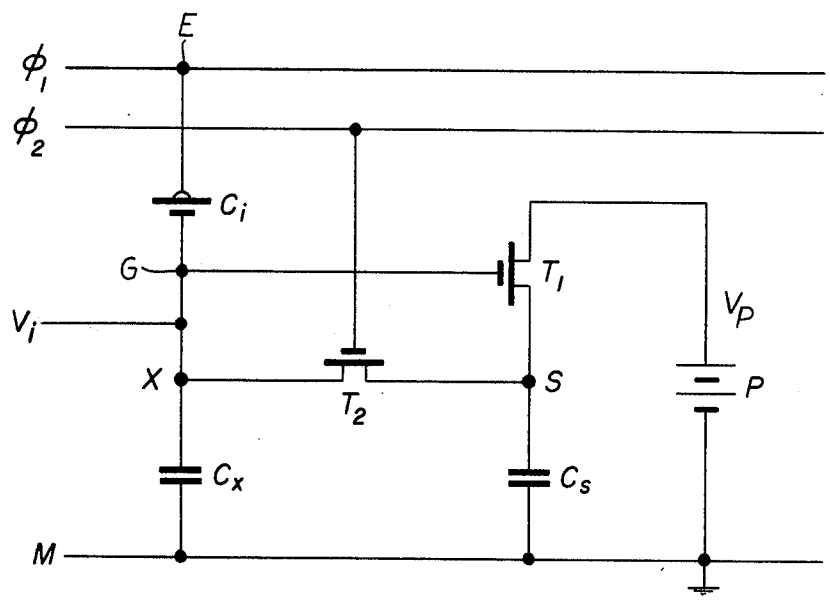
FIG. 2 is a circuit diagram of a dynamic memory stage embodying my invention.

A BICAP of the type shown in FIGS. 1A and 1B, designated $C_i$, forms part of a circuit arrangement according to my invention as illustrated in FIG. 2. This system comprises a ground lead M tied to the negative pole of a battery P generating a unipolar supply voltage $V_p$, e.g. of $+1.5$ V, this battery being connected by way of the channel electrodes of a first IGFET $T_1$ to a junction S between the source electrode of that IGFET and a plate of a main storage capacitor $C_s$ whose other plate is grounded at conductor M. A second IGFET $T_2$ has its drain and source electrodes respectively connected to junction S and to another junction X formed between a plate of an ancillary storage capacitor $C_x$, whose other plate is also grounded at conductor M, and the gate terminal G of BICAP $C_i$ whose source terminal E is tied to a control conductor $\Phi_1$. Junction X is also tied to the gate of IGFET $T_1$. The gate of IGFET $T_2$ is joined to another control conductor $\Phi_2$, conductors $\Phi_1$ and $\Phi_2$ carrying respective trains of clock pulses $V_{\Phi 1}$ and of unblocking pulses $V_{\Phi 2}$ as shown in the two top graphs of FIG. 2A. The two pulse trains are of the same cadence and are relatively staggered by about half a pulse period. Capacitor $C_x$ encompasses all the stray capacitances existing between junction X and ground.

Figure 3:
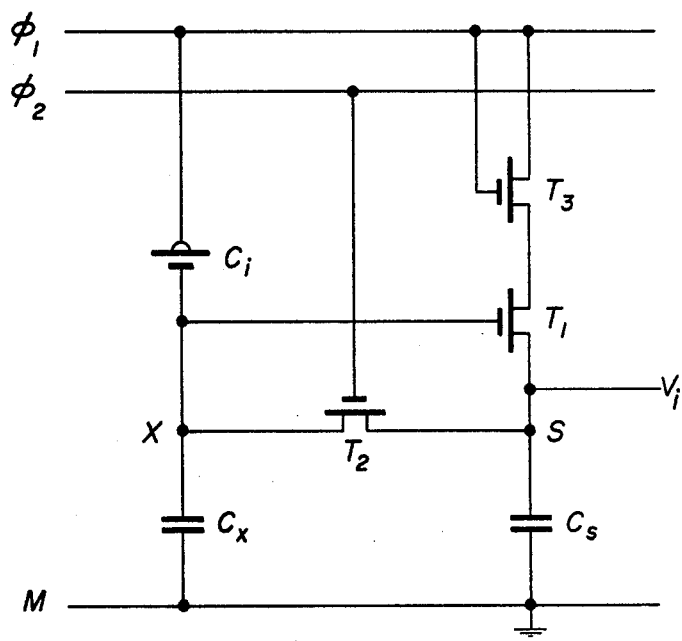
FIGS. 3 and 4 are circuit diagrams similar to FIG. 2, showing certain modifications.

At certain intervals advantageously coinciding with unblocking pulses $V_{\Phi 2}$, but recurring with a substantially lower cadence (e.g. 1 Hz in the case of a wristwatch), one of the two junctions X, S is temporarily connected to an external circuit carrying a binary input signal $V_i$ to be stored, e.g. through the intermediary of a further IGFET triggered by a control pulse as shown in the aforementioned U.S. Pat. No. 3,943,496. In FIG. 2 this signal $V_i$ is shown applied to junction X, though it could also be fed into junction S as indicated in FIG. 3. When signal $V_i$ has the logical value "zero", i.e. is at or near ground level, capacitor $C_x$ is discharged if it was previously charged. The unblocking pulse $V_{\Phi 2}$ coinciding with the control pulse renders IGFET $T_2$ conductive whereby any residual charge of capacitor $C_s$ is also removed. BICAP $C_i$ then has a low capacitance, on the order of that of storage capacitor $C_x$ which may have a value of 0.1 pF, for example, compared with a capacitance of 2 pF for capacitor $C_s$. Thus, a clock pulse $V_{\Phi 1}$ subsequently arriving over conductor $\Phi_1$ reaches the junction X with a relatively reduced amplitude, below the threshold voltage $V_T$ of IGFET $T_1$ which therefore remains nonconducting and keeps the junction S disconnected from positive battery. Voltage $V_T$ may also be the threshold for IGFET $T_2$ and BICAP $C_i$.

Figure 2A:
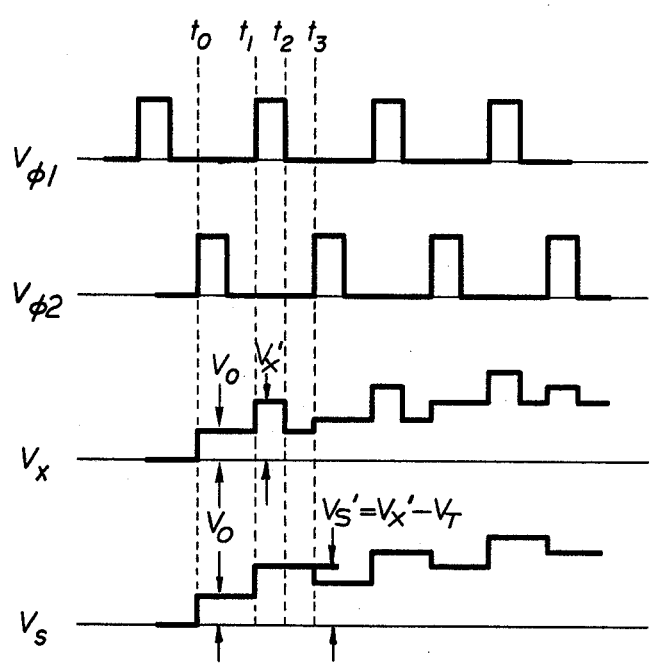
FIG. 2A is a set of graphs illustrating the operation of the system of FIG. 2.

Let us now consider the arrival of an input signal $V_i$ of logical value "1" which charges the capacitors $C_x$ and $C_i$ to a level $V_o$, sufficient to increase the capacitance of the BICAP to its elevated value, at a time $t_0$ coinciding with the appearance of an unblocking pulse $V_{\Phi 2}$. The IGFET $T_2$ now conducts and charges the capacitor $C_s$ so that the two junction potentials $V_x$ and $V_s$ are at the level $V_o$, as indicated in the two bottom graphs of FIG. 2A. The next clock pulse $V_{\Phi 1}$, arriving at a time $t_1$, is thus transmitted to junction X with only a relatively small reduction in amplitude inasmuch as IGFET $T_2$ inhibits the charge transfer between the two junctions, thereby raising the voltage of junction X to a level $V_x'$ which lies sufficiently above voltage $V_s = V_o$ to render IGFET $T_1$ conductive. Battery P now charges the main storage capacitor $C_s$ to a level $V_s' = V_x' - V_T$ whereupon IGFET $T_1$ cuts off even if pulse $V_{\Phi 1}$ is still in existence. Upon the termination of this pulse, at an instant $t_2$, voltage $V_x$ returns to its previous level. If the next unblocking pulse $V_{\Phi 2}$ still exceeds that voltage level $V_x = V_o$ by more than the threshold voltage $V_T$, IGFET $T_2$ is again turned on at a time $t_3$ to equalize the voltages at junctions S and X. This sequence may recur several times, as shown in FIG. 2A, until voltages $V_s$ and $V_x$ have substantially reached the level of supply voltage $V_p$ to which the capacitors $C_s$ and $C_x$ are periodically recharged to compensate for leakage losses. The signal of logical value "1" may thus be preserved for an indefinite time and may be read out at either junction.

If the input signal $V_i$ were fed in during an interval between pulses $V_{\Phi 1}$ and $V_{\Phi 2}$, the conduction of IGFET $T_2$ on the next unblocking pulse would also charge the storage capacitor $C_s$ but would lower the voltage $V_x$ in the process. A larger signal voltage $V_i$ would therefore be required.

As illustrated in FIG. 3, battery P of FIG. 2 can be omitted if the charging circuit of capacitor $C_s$ is extended to conductor $\Phi_1$ through the intermediary of a unidirectionally conducting semiconductor element such as a third IGFET $T_3$ in series with IGFET $T_1$. IGFET $T_3$ has its gate and drain electrodes both tied to conductor $\Phi_1$ so as to operate as a diode; in principle, therefore, a simple diode may be substituted for this IGFET. The operation of this system is otherwise similar to that of the circuit arrangement of FIG. 2.

Figure 4:
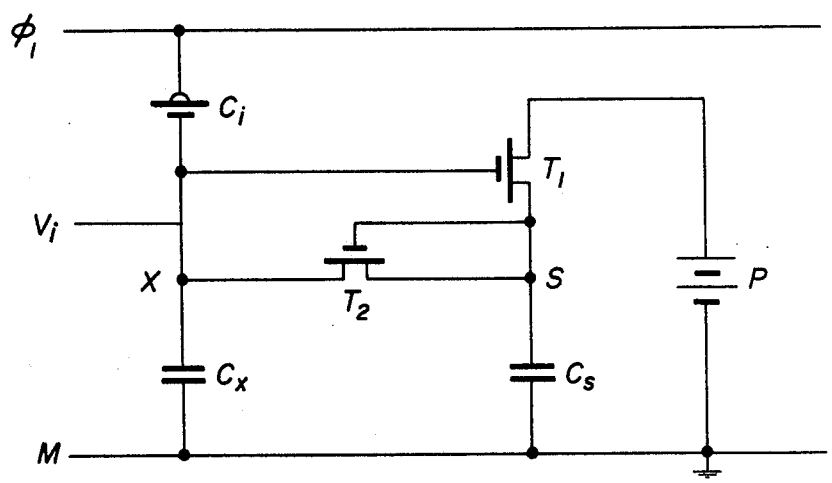

In FIG. 4 I have shown a memory stage which differs from that of FIG. 2 by the omission of conductor $\Phi_2$, the gate of IGFET $T_2$ being here connected to junction S whereby this IGFET also operates as a diode. In the presence of a clock pulse $V_{\Phi 1}$ (FIG. 2A), IGFET $T_1$ conducts only when its gate voltage $V_x$ exceeds its source voltage $V_s$ by more than the threshold voltage $V_T$, i.e. when IGFET $T_2$ (or an equivalent diode substituted therefor) is cut off. When, after the disappearance of the clock pulse, the potential of junction X returns to its previous value as discussed above, a charge present on capacitor $C_s$ is communicated to capacitor $C_x$ if voltage $V_s$ is sufficiently higher than voltage $V_x$. In the embodiment of FIG. 4, therefore, junction X will be at a generally lower potential than junction S during storage of a logical "1". If desired, the battery P may also be replaced in FIG. 4 by a third IGFET $T_3$, as shown in FIG. 3, or an equivalent diode.

Since the raising of the input voltage $V_o$ to level $V_x'$ by the clock pulse $V_{\Phi 1}$ results in a partial transfer of the charge of BICAP $C_i$ to capacitor $C_x$ (which also includes the gate capacitance of IGFET $T_1$), the magnitude of that input voltage should be considerably higher than the threshold voltage $V_T$ in order to insure a dependable periodical compensation of leakage losses when the stored signal has the logical value "1". With $V_T = 0.2$ V, for example, voltage $V_o$ should be at least equal to 0.8 V. In this case a system with the numerical values $C_x = 0.1$ pF, $C_s = 2$ pF and $V_p = 1.5$ V as given above, and with the amplitude of the clock pulses substantially equaling the supply voltage $V_p$, proper operation will be assured, i.e. the capacitor $C_s$ will be charged to a voltage $V_s' \approx V_p$, even if the capacitance of BICAP $C_i$ at its elevated value is as low as 0.15 pF; if IGFET $T_2$ were not cut off in the presence of a clock pulse $V_{\Phi 1}$, that capacitance would have to be about 1.8 pF (i.e. increased more than ten times to a value approaching that of main capacitance $C_s$) under otherwise identical conditions. A BICAP having a capacitance of 0.15 pF will enable the circuit to reduce the voltage of the main storage capacitor $C_s$ periodically by as large as 0.7 V, i.e. to the level of 0.8 V; if IGFET $T_2$ were not cut off in the presence of a clock pulse $V_{\Phi 1}$, this reduced voltage would approximately equal the magnitude of the threshold voltage, i.e. 0.2 V in lieu of 0.7 V, and the admissible leakage losses therefore would be limited in the same proportion.

If the BICAP and the transistors in the described system were replaced by corresponding semiconductor elements in which the p-type and n-type zones are interchanged, voltages of inverted polarity would of course have to be used in the described system.

I claim:

1. A circuit arrangement for the storage of a signal voltage of predetermined level, comprising:

two conductors connected across a source of recurrent unipolar clock pulses, one of said conductors being grounded;

a main storage capacitor and an ancillary storage capacitor both connected to said one of said conductors;

supply means including at least said one of said conductors for charging said main storage capacitor with a voltage having the same polarity as said clock pulses;

a normally nonconductive first semiconductor element inserted between said supply means and said main storage capacitor on the side opposite said one of said conductors, said first semiconductor element forming a first junction with said main storage capacitor and being provided with a control electrode;

a binary capacitor of the same conductivity type as said first semiconductor element inserted between said ancillary storage capacitor and the other of said conductors, said binary capacitor forming with said ancillary storage capacitor a second junction tied to said control electrode, at least one of said junctions being temporarily connectable to an external signaling circuit for the selective charging and discharging of the respective storage capacitor, the capacitance of said binary capacitor in the presence of a clock pulse having a relatively low value in the discharged state of said ancillary storage capacitor and having a relatively high value upon said ancillary storage capacitor carrying a predetermined minimum charge, said high value enabling conduction of said first semiconductor element for the duration of a driving pulse whereby said main storage capacitor is charged from said supply means; and a second semiconductor element inserted between said junctions for enabling the transfer of charges from said main storage capacitor to said ancillary storage capacitor between clock pulses while preventing a reverse charge transfer in the presence of a clock pulse;

said supply means including a third semiconductor element inserted between said other of said conductors and said first semiconductor element for transmitting said clock pulses to said main storage capacitor in the conductive condition of said first semiconductor element.

2. A circuit arrangement as defined in claim 1 wherein said supply means comprises a generator of continuous direct current.

3. A circuit arrangement as defined in claim 1 wherein said third semiconductor element is a field-effect transistor of the same conductivity type as said first semiconductor element, with a pair of channel electrodes and an insulated gate, said gate and one of said channel electrodes being connected to said other of said conductors.

4. A circuit arrangement as defined in claim 3 wherein said second semiconductor element is another field-effect transistor of the same conductivity type as said first semiconductor element, with a pair of channel electrodes respectively connected to said junctions and with an insulated gate connected to a point of variable voltage.

5. A circuit arrangement as defined in claim 4 wherein said point of variable voltage lies on a third conductor connected together with said one of said conductors across a source of unblocking pulses of the same polarity as said clock pulses and offset from the latter.

6. A circuit arrangement as defined in claim 4 wherein said point is said first junction.

7. A circuit arrangement as defined in claim 1 wherein said high value of the capacitance of said binary capacitor is substantially smaller than the capacitance of said main storage capacitor.

* * * * *